United States Patent
Venkatasubramanian et al.

(10) Patent No.: US 8,694,843 B2
(45) Date of Patent: Apr. 8, 2014

(54) CLOCK CONTROL OF PIPELINED MEMORY FOR IMPROVED DELAY FAULT TESTING

(75) Inventors: Ramakrishnan Venkatasubramanian, Plano, TX (US); Sumant Kale, Allen, TX (US); Abhijeet Ashok Chachad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 384 days.

(21) Appl. No.: 13/198,324

(22) Filed: Aug. 4, 2011

(65) Prior Publication Data

US 2013/0036337 A1 Feb. 7, 2013

(51) Int. Cl.
*G01R 31/28* (2006.01)
(52) U.S. Cl.
USPC .................. 714/726; 714/724; 714/729
(58) Field of Classification Search
CPC ............... G01R 31/318594; G01R 31/318552; G01R 31/28; G01R 31/318541; G01R 31/318555; G01R 31/31858; G01R 31/31922; G01R 9/3869
USPC ........... 714/726, 729, 30, 724, 799, 731, 727; 365/230.03, 201
See application file for complete search history.

(56) References Cited

U.S. PATENT DOCUMENTS

| | | | | |
|---|---|---|---|---|
| 5,161,160 A * | 11/1992 | Yaguchi et al. | ............... | 714/729 |
| 5,276,857 A * | 1/1994 | Hartung et al. | ............... | 714/724 |
| 6,877,123 B2 * | 4/2005 | Johnston et al. | ............. | 714/731 |
| 7,444,567 B2 * | 10/2008 | Wang et al. | ................... | 714/726 |
| 7,657,809 B1 * | 2/2010 | Bhatia | ......................... | 714/729 |
| 7,689,885 B2 * | 3/2010 | Kaibel et al. | ................. | 714/731 |
| 7,710,801 B2 * | 5/2010 | Li | ................................. | 365/201 |
| 7,747,920 B2 * | 6/2010 | Wang et al. | ................... | 714/731 |
| 7,793,179 B2 * | 9/2010 | Sul | ............................... | 714/726 |
| 7,925,465 B2 * | 4/2011 | Lin et al. | ....................... | 702/124 |
| 8,290,738 B2 * | 10/2012 | Lin et al. | ...................... | 702/124 |
| 8,375,265 B1 * | 2/2013 | Venkatasubramanian et al. | ............................. | 714/731 |
| 2007/0061657 A1 * | 3/2007 | Chang et al. | .................. | 714/742 |
| 2011/0307750 A1 * | 12/2011 | Narayanan et al. | .......... | 714/729 |

* cited by examiner

*Primary Examiner* — Phung M Chung
(74) *Attorney, Agent, or Firm* — John R. Pessetto; Wade J. Brady, III; Frederick J. Telecky, Jr.

(57) ABSTRACT

In an embodiment of the invention, a pipelined memory bank is tested by scanning test patterns into an integrated circuit. Test data is formed from the test patterns and shifted into a scan-in chain in the pipelined memory bank. The test data in the scan-in chain is launched into the inputs of the pipelined memory bank during a first clock cycle. Data from the outputs of the pipelined memory bank is captured in a scan-out chain during a second cycle where the time between the first and second clock cycles is equal to or greater than the read latency of the memory bank.

20 Claims, 5 Drawing Sheets

CLOCK CONTROL OF PIPELINED MEMORY FOR IMPROVED DELAY FAULT TESTING

BACKGROUND

Integrated circuits (ICs) often contain millions of transistors and millions of interconnections. To verify that these transistors and interconnections are manufactured as intended (i.e. defect free), they must be tested. Many testing techniques may be used to verify the operation of an IC.

For example, broadside testing includes electrically stimulating the inputs of an IC and measuring the outputs of the IC to determine if the output matches the predicted output. In the case where the predicted output matches the measured output, the IC may be functioning correctly. However, this test alone does not guarantee that the IC will function 100 percent correctly. More tests are needed to verify that the IC is operating as designed.

In the case where broadside testing is used and the measured output does not match the predicted output, the IC may not be operating correctly. This type of testing indicates that there may be problems with the IC. However, this type of testing usually does not indicate what in particular caused the IC to operate incorrectly. To better diagnose what may be causing the IC to fail, internal scan testing may be used.

Internal scan testing provides a means to test interconnections and transistors without using physical test probes. Internal scan testing usually adds one or more so called 'test cells' connected to each pin of an IC that can selectively override the functionality of that pin. These cells can be programmed via a JTAG (Joint Test Action Group) test chain to drive a signal onto a pin and across an individual interconnection. The cell at the destination of the interconnection can then be programmed to read the value at the pin, verifying that the IC trace properly connects the two pins. If the trace is shorted to another signal or if the trace has been cut, the correct signal value may not be presented at the destination pin, and the IC will be observed to have a fault.

In addition to providing a means to test interconnections and transistors without using physical test probes, internal scan testing provides the means for testing delay paths on an integrated circuit. Delay fault ("at-speed" or "cycle-by-cycle") testing is a test methodology used to measure the time required for a signal to travel through a delay path in logic block or a memory array on an integrated circuit. This time is often called the delay time Td. Usually, the highest frequency Fmax at which an integrated circuit may operate is determined by the longest delay time Td on the integrated circuit. In this case, the highest clock frequency that the integrated circuit may operate is Fmax=1/Td.

Because test cells can be used to force data into an IC, they may be used to set up test patterns. The relevant electronic states (ones and zeros) created as a result of the test patterns, may then be fed back into a test system to verify the functionality of a part of an IC. By adopting this technique, it is possible for a test system to gain test access to many parts of an IC. However, testing a pipelined memory using internal scan testing can be complex due to the read latency of the pipelined memory.

A pipeline with respect to a computer is the continuous and somewhat overlapped movement of data to a processor. Pipelining is the use of a pipeline. Without a pipeline, a computer processor gets the first instruction from memory, performs the operation it calls for, and then goes to get the next instruction from memory. While fetching (getting) the instruction, the arithmetic and logic unit (ALU) of the processor is idle. The processor usually has to wait until it gets the next instruction.

With pipelining, a computer architecture allows the next instructions to be fetched while the processor is performing arithmetic operations, holding them in a buffer close to the processor until each instruction operation can be performed. The staging of instruction fetching is continuous. The result is an increase in the number of instructions executed in a given time period.

Pipelines and pipelining also apply to computer memory controllers and moving data through various memory staging places. Data may be pipelined (written or read) to banks of memory when the memory addresses have some order. For example, writing or reading data that have consecutive addresses allows data to be pipelined from different memory banks. However, when a non-sequential read or write occurs, data pipelining is interrupted and the full access time of the memory is required to complete the read or write of the memory. The access time may be 3 or 4 clock cycles for example.

Because the read latency of a pipelined memory can be one or more clock cycles, internal scan testing of the pipelined memory can be complex. Testing the read latency of a pipelined memory is important to ensure that a pipelined memory is operable.

DETAILED DESCRIPTION

The drawings and description, in general, disclose a method of testing integrated circuits containing pipelined memory arrays. A pipelined memory array contains pipelined memory banks. The read access time of a pipelined memory bank is usually greater than one clock cycle because a pipelined memory bank may contain 1 million bits or more of SRAM (Static Random Access Memory) storage and because the clock may be running at frequencies of 1 GHz or higher. Because the read access time of these pipelined memory banks is usually greater than a clock cycle, delay fault testing of paths starting from these pipelined memory banks can not be done using ATPG (automatic test pattern generated) testing on a cycle-by-cycle basis.

When paths from a pipelined memory bank are tested using ATPG test patterns on a cycle-by-cycle basis, the data output from the pipelined memory bank may be spurious. When the spurious data is scanned from the output of the pipelined memory bank, test coverage is reduced. However, when the output of the pipelined memory bank is captured in a scan-out test chain after a time equal to or greater than the read latency of the pipelined memory bank, correct data may be scanned out of a scan-out test chain. When compression and decompression are used along with the ATPG test patterns, spurious data from testing a pipelined memory bank on a cycle-by-cycle basis can cause even more errors. This will be explained in more detail later in the specification.

In an embodiment of the invention, the time at which data from a pipelined memory bank is captured in a scan-out chain is controlled by a clock control signal. The clock control signal also enables or disables the clocking of the pipelined memory bank such that a pipelined memory bank may be tested or not tested.

Figure 1:
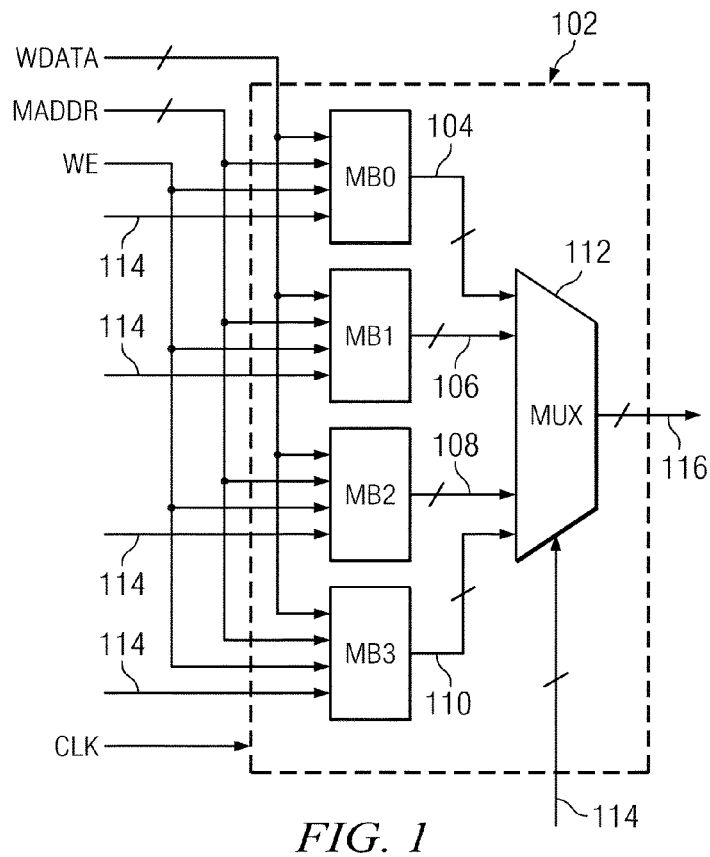
FIG. 1 is a block diagram of an embodiment of a pipelined memory array having four memory banks.

FIG. 1 is a block diagram of an embodiment of a pipelined memory array 102 having four memory banks MB0, MB1, MB2 and MB3. The pipelined memory array 102 may be a custom hard-wired macro for example. Each memory bank MB0, MB1, MB2 and MB3 has a write enable signal WE as an input. In addition, each memory bank MB0, MB1, MB2 and MB3 has input WDATA where data may be written to the individual memory bank when both the write enable signal WE and ME signal are asserted.

Each memory bank MB0, MB1, MB2 and MB3 is addressed with a mapped address MADDR. The mapped address is provided by a memory control circuit. The memory control circuit interleaves addresses such that consecutive addresses address a different memory bank. For example when there are four memory banks, the two least significant bits of an address may be used to determine which bank is addressed. For example least significant bits 00 would select memory bank MB0, least significant bits 01 would select memory bank MB1, least significant bits 10 would select memory bank MB2 and least significant bits 11 would select memory bank MB3.

In this example multiplexer select signal 114 is provided by a memory controller to select which memory bank MB0, MB1, MB2 or MB3 is addressed. The multiplexer select signal 114 may also be encoded instead of a one-hot as currently described in this embodiment. A clock signal CLK is connected to the pipelined memory array 102. The outputs 104, 106, 108 and 110 of memory banks MB0, MB1, MB2 and MB3 respectively are inputs to the multiplexer 112. Multiplexer select signal 114 selects which input of the multiplexer 112 is transferred to the output 116 of the multiplexer.

Figure 2:
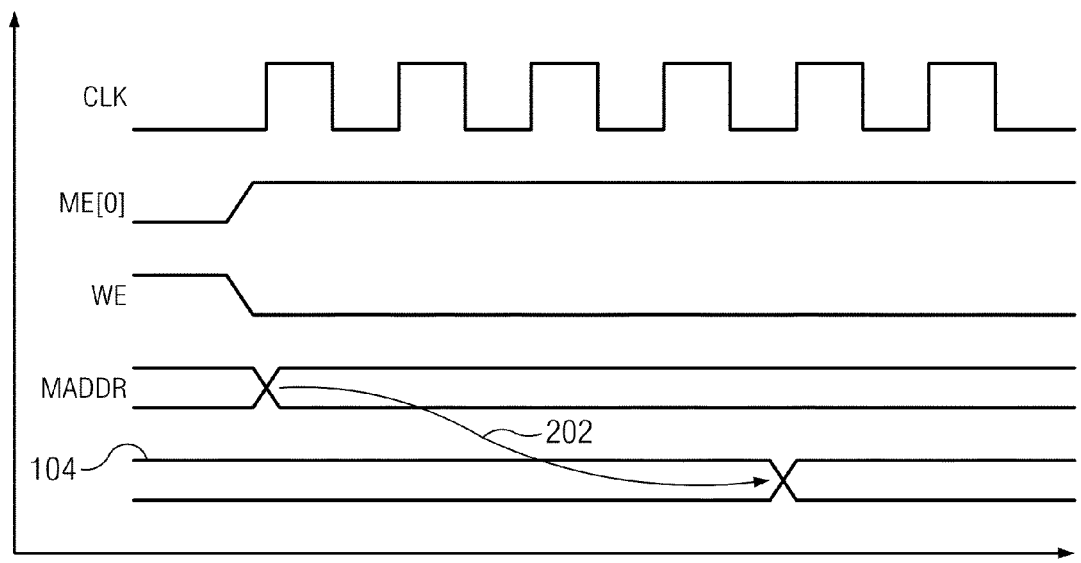
FIG. 2 is a timing diagram illustrating an embodiment of a read access time of memory bank 0.

FIG. 2 is a timing diagram illustrating an embodiment of a read access time of memory bank 0. In this example when memory enable signal ME[0] is activated (e.g. a high logical value), memory bank MB0 can be accessed. In the example shown in FIG. 2, a read access may occur in memory bank MB0 because the write enable signal WE is inactivated (e.g. a low logical level). When an address MADDR is applied to memory bank MB0, data from the output 104 of memory bank MB0 may be accessed. Read access time 202 is the time required to receive data at the output of a memory back from the time the memory bank is addressed. Read access time is measured in seconds.

In this example, the clock period is 833 picoseconds and the clock frequency is 1.2 GHz. The read access time 202 of memory bank MB0 is 2.9 nanoseconds. Because the read access time of is greater than 3 clock periods, four clock cycles are required before data will be available at the output 104 of memory bank MB0. Read latency is the number of clock cycles that must elapse before data is available at the output of a memory bank. In this example, because four clock cycles were required before data was available at the output of the memory bank, the read latency is four. Read latency is measured in clock cycles where clock cycles are an integer value.

Access latency is the number of clock cycles that must expire before a memory bank may be accessed (written to or read from) again. In the example shown in FIG. 2, four clock cycles must elapse before memory bank MB0 may be accessed again.

Figure 3:
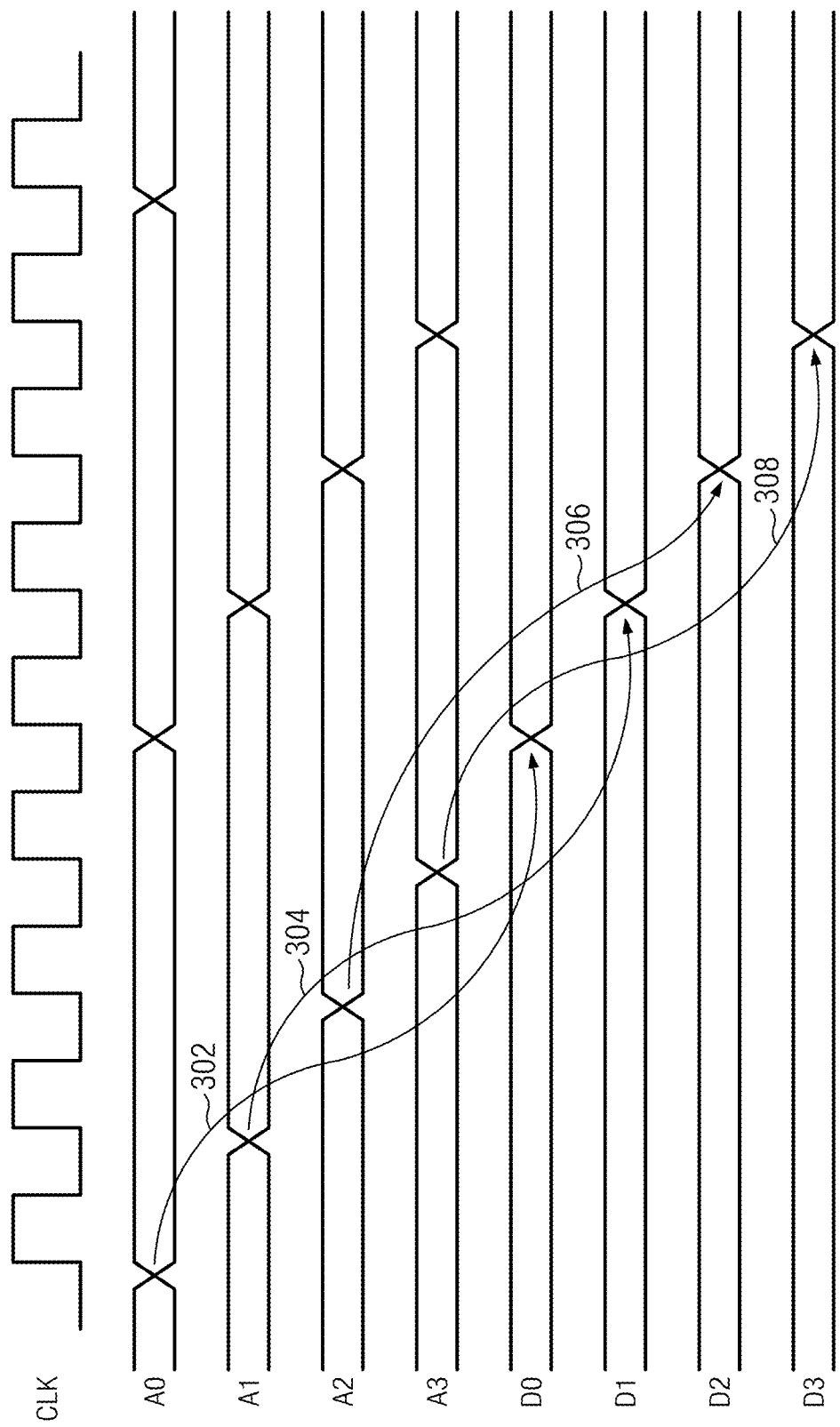
FIG. 3 is a timing diagram illustrating an embodiment of a pipelined memory array where consecutive read accesses are interleaved between four memory banks.

FIG. 3 is a timing diagram illustrating an embodiment of a pipelined memory array 102 where consecutive read accesses are interleaved between four memory banks MB0, MB1, MB2 and MB3. In this example, read accesses may occur after one clock cycle because a memory controller interleaved or "mapped" consecutive address to be applied to a different memory bank after each access.

A read address A0 is applied to memory bank MB0 before the rising edge of clock signal CLK. The data D0 from memory bank MB0 can not be read until four clock cycles after read address A0 is applied. However, because the read addresses are consecutive and address a different memory bank on each clock cycle, a second read address A1 can be applied to memory bank MB1 one clock cycle after the read address A0 is applied to memory bank MB0. The data D1 from memory bank MB1 can not be read until four clock cycles after read address A1 is applied.

Because the read addresses are consecutive and address a different memory bank on each clock cycle, a third read address A2 can be applied to memory bank MB2 one clock cycle after the read address A1 is applied to memory bank MB1. The data D2 from memory bank MB2 can not be read until four clock cycles after read address A2 is applied. A fourth read address A3 can be applied to memory bank MB3 one clock cycle after the read address A2 is applied to memory bank MB2. The data D2 from memory bank MB2 can not be read until four clock cycles after read address A2 is applied.

The read access times of memory banks MB0, MB1, MB2 and MB3 are indicated by arrows 302, 304, 306 and 308 respectively. In this example, the read access times are approximately 2.9 nanoseconds (greater than three clock cycles). However, once the "pipe" is full, data may be read from the pipelined memory array 102 every clock cycle. D1 follows D0 after one clock cycle. D2 follows D1 after one clock cycle. D3 follows D2 after one clock cycle. The pipelined memory array 102 may continue to read data every clock cycle as long as the addresses are consecutive. However, when a random read address occurs, the pipeline "stalls" and data from the output 116 of the pipelined memory array 102 can not be obtained until four clock cycles (its access latency) have expired.

Figure 4:
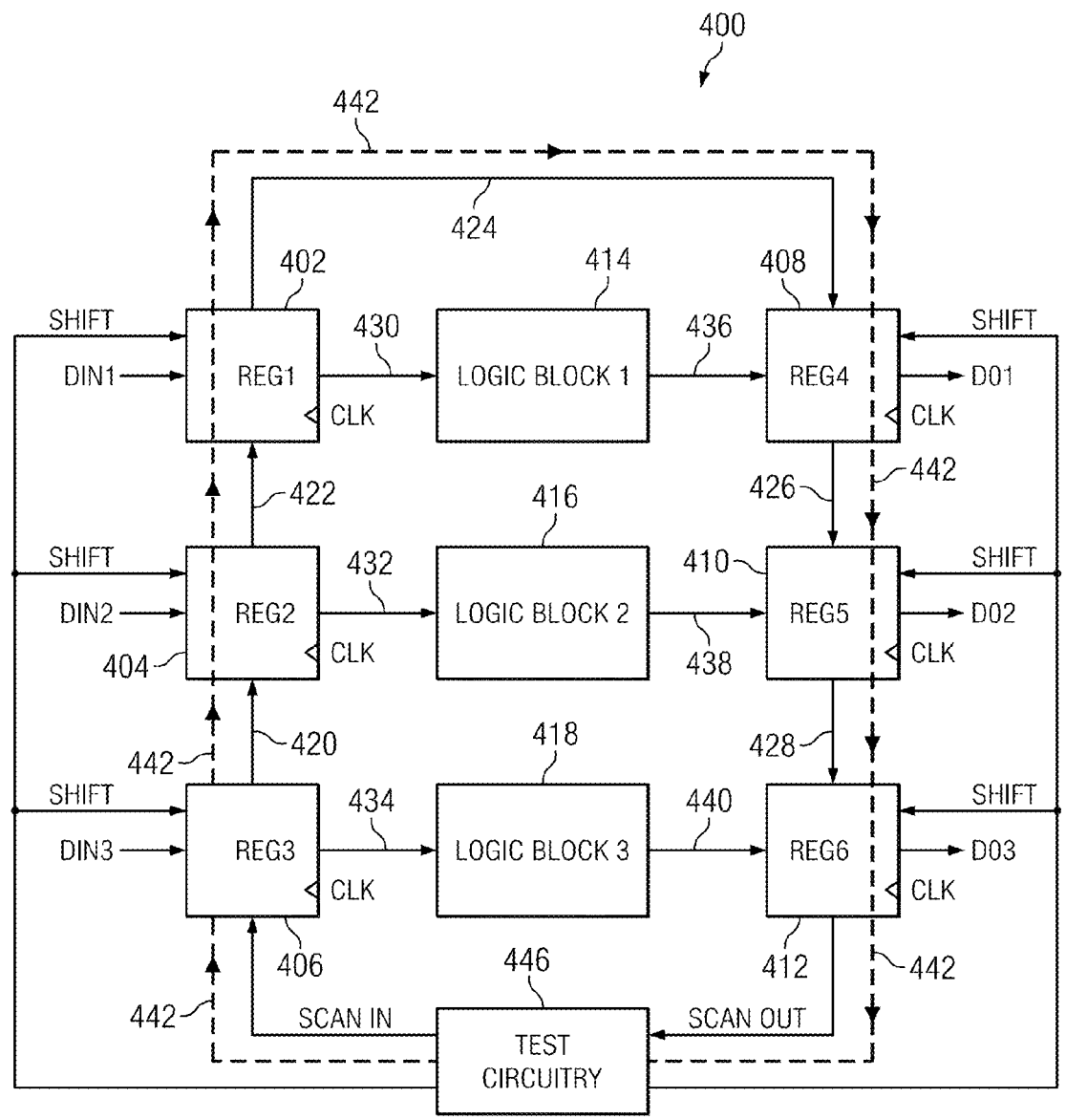
FIG. 4 is an embodiment of a scan path used to test three logic blocks.

FIG. 4 is a schematic drawing of an embodiment of a system 400 for testing logical blocks 414, 416 and 418 for faults using a scan chain. During normal operation, the registers 402, 404 and 406 receive data from inputs DIN1, DIN2 and DIN3 respectively. After receiving the data, the registers 402, 404 and 406, during a first cycle of clock CLK, apply the data to the logic blocks 414, 416, and 418 respectively. The output, 436, 438 and 440, from the logic blocks 414, 416 and 418 respectively is stored in registers 408, 410 and 412 respectively. On the next cycle of clock CLK, the outputs DO1, DO2 and DO3 are output to other circuits (not shown).

During scan mode, test data is scanned into registers 402, 404 and 406 via the scan chain 442 from test circuitry 446. In this example, in order to scan test data into registers 402, 404 and 406, the scan chain is shifted three times by a slower frequency clock supplied by an external tester. After the test data has been received by registers 402, 404 and 406, the test data is clocked by a faster clock internal to the integrated circuit into logic blocks 414, 416 and 418 respectively at the beginning of a clock cycle. The test output data 436, 438 and 440 are driven into registers 408, 410 and 412 respectively before the end of the clock cycle.

After receiving the test output data, the scan chain 442 is shifted three times by a slower frequency clock supplied by an external tester in order to drive the test output data into the test circuitry 446. After the test circuitry 445 receives the test output data, the test output data is observed to determine whether a fault has occurred in any of the logic blocks 414, 416 and 418.

Testability of an integrated circuit based on scan path testing and automatic test pattern generation was developed to test the functionality of gates and timing path on an integrated circuits. These techniques provided excellent coverage. However, as integrated circuits got larger physically, the ratio of logic to be tested per pin increased greatly. As a result, the amount of scan test data needed to test an integrated circuit increased greatly along with the time required to test the integrated circuit.

Hardware based on on-chip test compression techniques was developed to help address this problem. When an ATPG tool generates test patterns for a fault or a set of faults, only a small percentage of scan cells are needed to have specific values. Loading and unloading the test data is not efficient as a result. Test compression takes advantage of the small number of significant values to reduce test data and test time. In general, test compression modifies the design to increase the number of internal scan chains where each scan chain has a shorter length.

Figure 5:
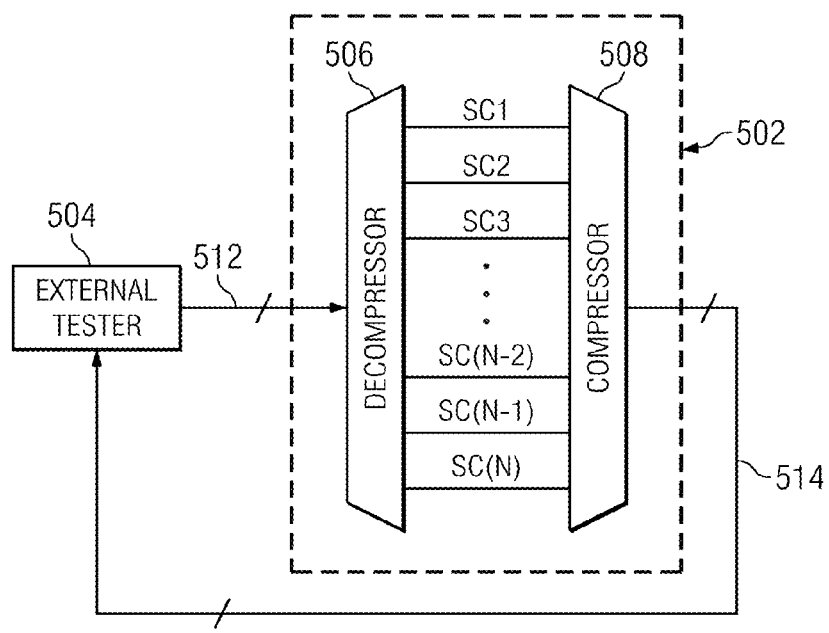
FIG. 5 is a block diagram showing compression and decompression of test data in order to allow more scan paths to be used on an integrated circuit.

FIG. 5 is a block diagram showing compression and decompression of test patterns in order to allow more scan paths to be used on an integrated circuit. Compressed test patterns 512 are transferred from an external tester 504 to an integrated circuit 502. After receiving the compressed test patterns 512 from the external tester 504, an on-chip decompressor 506 allows continuous flow decompression where the internal scan chains, SC1-SCN, are loaded as the test patterns are delivered to the decompressor 506. After the scan chains, SC1-SCN, have scanned in, clocked, and scanned out test data, a compressor 508 compresses the results and scans the results back to the external tester 504.

When one or more scan chains return spurious data "X", this spurious data X gets recirculated into the compressor/decompressor logic and reduces the overall test coverage (controllability and observability) of the scan test. Therefore it is important to control the propagation of spurious data X during scan mode testing.

Figure 6:
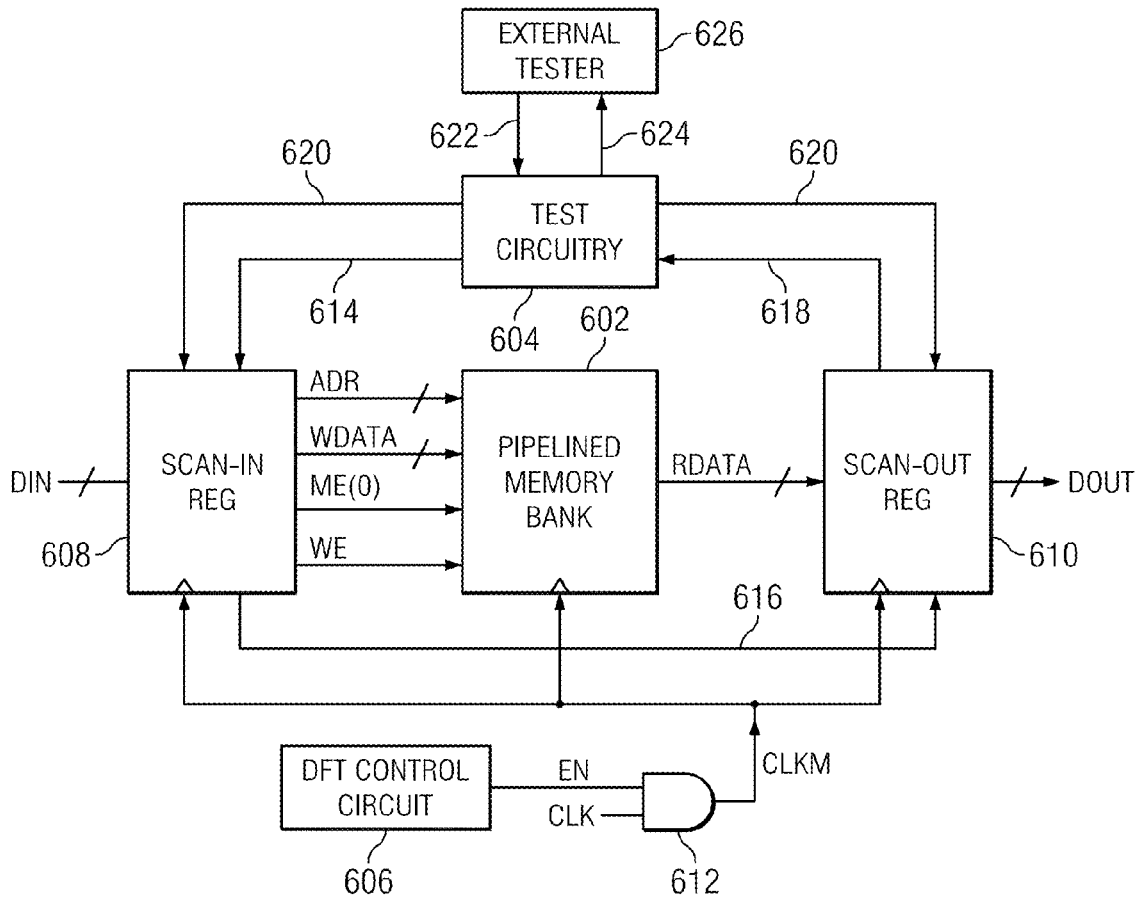
FIG. 6 is an embodiment of a scan path used to test a pipelined memory bank 602.
Figure 7:
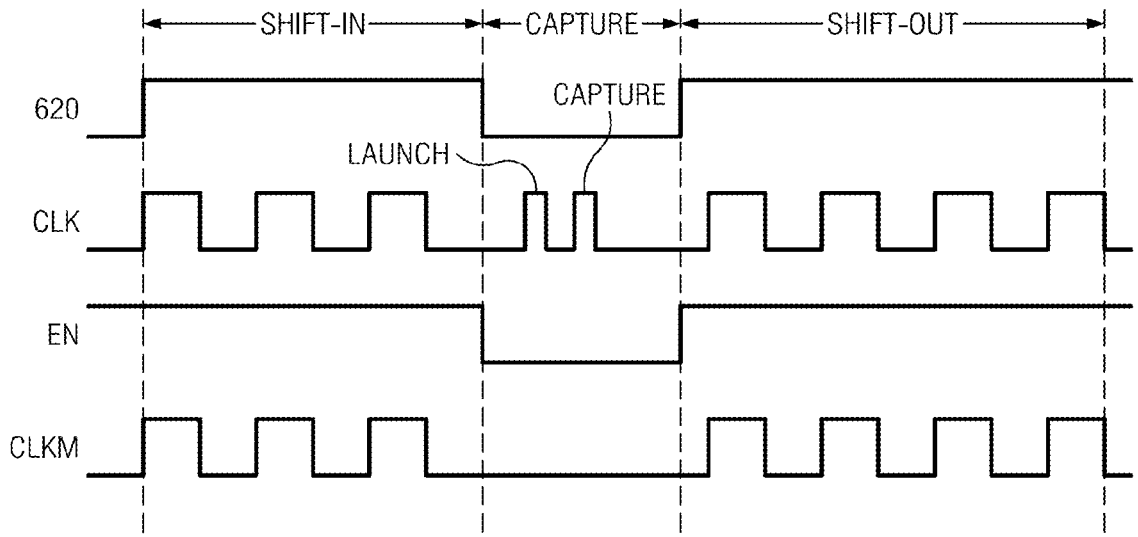
FIG. 7 is a timing diagram illustrating when scan paths used to test pipelined memory banks are disabled.

FIG. 6 is an embodiment of a scan path used to test a pipelined memory bank 602. In a first example, when scan-enable 620 is high (see FIG. 7), test data is shifted from the test circuitry 604 into the scan-in registers 608 using clock CLKM (see FIG. 7). During shift-in, the frequency of clocks CLKM and CLK is slower than the clock frequency during at-speed testing. Clock CLKM to the pipelined memory bank 602 is enabled during the shift-in because signal EN is high.

After test data is scanned into scan-in registers 608, scan-enable 620 goes low and the system clock CLK becomes active. In this case because the clock control signal EN is disabled (low), the clock signal CLKM to the pipelined memory bank 602 remains inactive (low). As a result, input data (i.e. ADR, WDATA, ME(0), WE) scanned into the scan-in register 608 are not clocked into the pipelined memory bank 602. Also, RDATA is not clocked into the scan-out register 610. The clock control signal EN is this example is asynchronous and does not create any timing issues for chip-level timing.

In this first example, other scan chains (not shown) are activated at the same time to test for delay faults in other areas of the integrated circuit (e.g. logic blocks). In these other scan chains, test data is shifted into scan-in registers 608 while scan-enable 620 is high. After test data is shifted into the scan-in registers 608 by clock CLK (the frequency of CLK during this time is slower than when logic is test at speed), the scan-enable 620 is inactivated and test data is "launched" into logic blocks, for example, on a first clock cycle CLK (the frequency of CLK during this time is equal to the frequency of the clock CLK used during normal operation of the integrated circuit). On the subsequent clock cycle CLK, the test data is "captured" in scan-out registers. Next, scan-enable 620 is activated and the test data is shifted by clock CLK (the frequency of CLK during this time is slower than when logic is tested at speed) to the test circuitry 604. After the test data has been received by the test circuitry 604, it can be determined if there are any delay faults in the logic blocks tested by the scan chains.

In this first example, the read latency of the pipelined memory bank 602 is equal to four clock CLK cycles. As a result, four clock CLK cycles are required before valid data appears at RDATA. In this example because one clock CLK cycle immediately follows a first clock CLK cycle, there is not enough time for valid data to be produced at RDATA. Because the clock control signal EN remained low during the capture time, spurious data from the pipelined memory bank 602 was not captured in the scan-out register. If spurious data from the pipelined memory bank 602 had been captured and then subsequently shifted into the test circuitry 604, the spurious data would corrupt test data from other scan chains that were tested at the same time.

In the first example, the pipelined memory bank 602 was not tested for delay faults while logic blocks were tested for delay faults. In the next example, the pipelined memory bank can be scan tested for delay faults by controlling the clock CLKM.

In a second example of the invention, during scan-enable 620 (see FIG. 8), test data is shifted from the test circuitry 604 into the scan-in registers 608 using clock CLKM (the frequency of CLKM during this time is lower than when testing at speed). After test data is scanned into scan-in register 608, scan-enable 620 is turned off and a first clock CLKM pulse, "launch", is clocked during the capture time. As a result, input data (i.e. ADR, WDATA, ME(0), WE) scanned into the scan-in registers 608 are launched into the pipelined memory bank 602. The clock control signal EN is this example is asynchronous and does not create any timing issues for chip-level timing.

Figure 8:
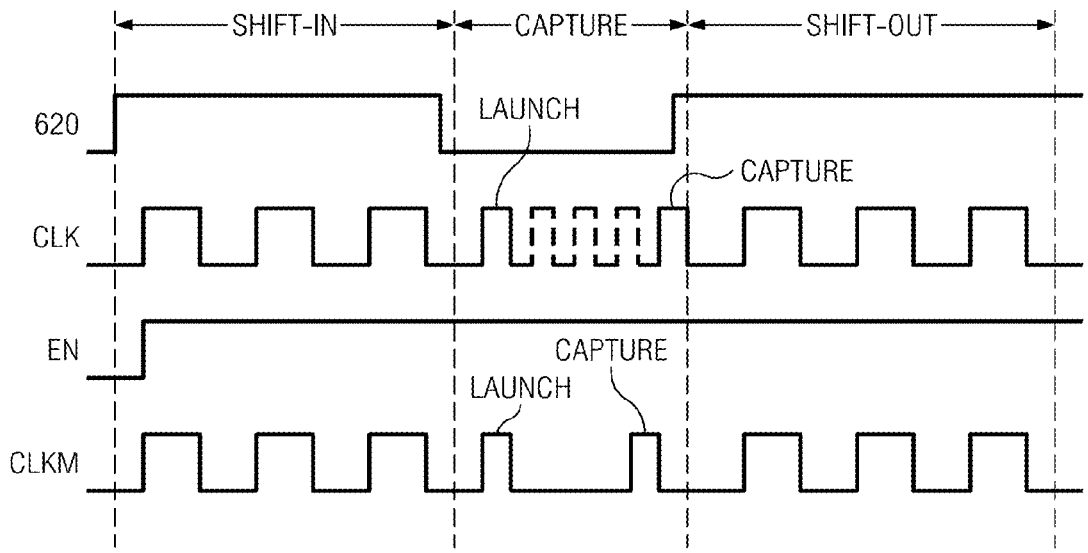
FIG. 8 is a timing diagram illustrating when scan paths used to test pipelined memory banks are enabled.

In this second example, the read latency of the pipelined memory bank 602 is equal to four clock CLK cycles. As a result, four clock CLK cycles are required before valid data appears at RDATA. Because four clock cycles are required before valid data appears at RDATA, a second clock CLKM pulse, "capture", can only be clocked four clock cycles after the first clock pulse. The clock CLK shown in FIG. 8 shows three "dashed" clock CLK cycles to indicate that four clock cycles must occur between the launch pulse and the capture pulse of clock CLK. The three dashed clock CLK cycles do not actually fire during this time and are only shown for illustrative purposes.

After the capture pulse CLKM is fired valid data at RDATA is captured in the scan-out registers 610. Valid data from RDATA was captured in the scan-out registers 610 because four clock cycles occurred before reading the pipelined memory bank 602. After valid data from RDATA is captured in the scan-out registers 610, the scan-enable 620 is enabled.

After the scan-enable 620 is enabled, data from the scan-out register 610 is shifted into the test circuitry where it can be evaluated for delay faults.

In example 2, any delay fault testing done on logic blocks will not be valid because the delay fault testing was done with a four cycle delay; not on a cycle-by-cycle basis. Delay fault testing using the methods shown in example 1 and example 2 make it possible to test most delay paths on an integrated circuit.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A non-transitory computer readable medium carrying one or more sequences of instructions for causing a digital processing system to facilitate testing of logic circuits on an integrated circuit, wherein execution of said one or more sequences of instructions by one or more processors contained in said digital processing system for testing said integrated circuit causes said digital processing system to perform the actions of:
   scanning compressed test patterns into the integrated circuit;
   decompressing the compressed test patterns;
   forming test data from the decompressed test patterns;
   shifting the test data into scan-in chains;
   halting cycling of clocks to pipelined memory banks on the integrated circuit to prevent incorrect data from being read into scan-out chains by the pipelined memory banks during testing of the logic circuits;
   launching the test data from the scan-in chains into the logic circuits during a first clock cycle;
   capturing data from outputs of the logic circuits into scan-out chains during a second clock cycle;
   wherein the second clock cycle immediately follows the first clock cycle, the second and first clock cycles having the same period.

2. The non-transitory computer readable medium of claim 1 wherein a clock control signal halts the cycling of the clocks to the pipelined memory banks on the integrated circuit.

3. The non-transitory computer readable medium of claim 2 wherein the clock control signal is generated in a design-for-test control circuit on the integrated circuit.

4. The non-transitory computer readable medium of claim 2 wherein the clock control signal is asynchronous.

5. The non-transitory computer readable medium of claim 1 wherein the test patterns are generated to test delay faults on the integrated circuit.

6. A non-transitory computer readable medium carrying one or more sequences of instructions for causing a digital processing system to facilitate testing of a pipelined memory bank on an integrated circuit, wherein execution of said one or more sequences of instructions by one or more processors contained in said digital processing system for testing said pipelined memory bank causes said digital processing system to perform the actions of:
   scanning compressed test patterns into the integrated circuit;
   decompressing the compressed test patterns;
   forming test data from the decompressed test patterns;
   shifting the test data into a scan-in chain;
   launching the test data from the scan-in chain into inputs of the pipelined memory bank during a first clock cycle;
   capturing data from outputs of the pipelined memory bank into scan-out chains during a second clock cycle;
   wherein the time between the second clock cycle and the first clock cycle is equal to or greater than a read latency of the pipelined memory bank.

7. The non-transitory computer readable medium of claim 6 wherein a clock control signal enables cycling of clocks to the pipelined memory bank.

8. The non-transitory computer readable medium of claim 7 wherein the clock control signal is generated in a design-for-test control circuit on the integrated circuit that contains the pipelined memory bank.

9. The non-transitory computer readable medium of claim 7 wherein the clock control signal is asynchronous.

10. The non-transitory computer readable medium of claim 1 wherein the test patterns are generated to test delay faults in the pipelined memory bank.

11. A non-transitory computer readable medium carrying one or more sequences of instructions for causing a digital processing system to facilitate testing of logic circuits on an integrated circuit, wherein execution of said one or more sequences of instructions by one or more processors contained in said digital processing system for testing said integrated circuit causes said digital processing system to perform the actions of:
   scanning test patterns into the integrated circuit;
   forming test data from the test patterns;
   shifting the test data into scan-in chains;
   halting cycling of clocks to pipelined memory banks on the integrated circuit to prevent incorrect data from being read into scan-out chains by the pipelined memory banks during testing of the logic circuits;
   launching the test data from the scan-in chains into the logic circuits during a first clock cycle;
   capturing data from outputs of the logic circuits into scan-out chains during a second clock cycle;
   wherein the second clock cycle immediately follows the first clock cycle, the second and first clock cycles having the same period.

12. The non-transitory computer readable medium of claim 11 wherein a clock control signal halts the cycling of clocks to the pipelined memory banks on the integrated circuit.

13. The non-transitory computer readable medium of claim 12 wherein the clock control signal is generated in a design-for-test control circuit on the integrated circuit.

14. The non-transitory computer readable medium of claim 12 wherein the clock control signal is asynchronous.

15. The non-transitory computer readable medium of claim 11 wherein the test patterns are generated to test delay faults on the integrated circuit.

16. A non-transitory computer readable medium carrying one or more sequences of instructions for causing a digital processing system to facilitate testing of a pipelined memory bank on an integrated circuit, wherein execution of said one or more sequences of instructions by one or more processors contained in said digital processing system for testing said pipelined memory bank causes said digital processing system to perform the actions of:
   scanning test patterns into the integrated circuit;
   forming test data from the test patterns;
   shifting the test data into a scan-in chain;

launching the test data from the scan-in chain into inputs of the pipelined memory bank during a first clock cycle;

capturing data from outputs of the pipelined memory bank into scan-out chains during a second clock cycle;

wherein the time between the second clock cycle and the first clock cycle is equal to or greater than a read latency of the pipelined memory bank.

17. The non-transitory computer readable medium of claim 16 wherein a clock control signal enables cycling of clocks to the pipelined memory bank.

18. The non-transitory computer readable medium of claim 17 wherein the clock control signal is generated in a design-for-test control circuit on the integrated circuit that contains the pipelined memory bank.

19. The non-transitory computer readable medium of claim 17 wherein the clock control signal is asynchronous.

20. The non-transitory computer readable medium of claim 1 wherein the test patterns are generated to test delay faults in the pipelined memory bank.

* * * * *